(12) United States Patent
Peng

(10) Patent No.: US 8,609,466 B2
(45) Date of Patent: Dec. 17, 2013

(54) CAP AND SUBSTRATE ELECTRICAL CONNECTION AT WAFER LEVEL

(75) Inventor: Jung-Huei Peng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 61 days.

(21) Appl. No.: 12/503,311

(22) Filed: Jul. 15, 2009

(65) Prior Publication Data
US 2011/0014750 A1 Jan. 20, 2011

(51) Int. Cl.
*H01L 21/50* (2006.01)

(52) U.S. Cl.
USPC ............. 438/121; 438/51; 438/55; 438/64; 257/E21.499

(58) Field of Classification Search
USPC ......................... 438/51, 55, 64, 121
See application file for complete search history.

(56) References Cited

U.S. PATENT DOCUMENTS

| | | | |
|---|---|---|---|
| 7,157,372 B1 | 1/2007 | Trezza | |
| 7,215,032 B2 | 5/2007 | Trezza | |
| 7,482,272 B2 | 1/2009 | Trezza | |
| 7,521,806 B2 | 4/2009 | Trezza | |
| 7,534,722 B2 | 5/2009 | Trezza | |
| 7,538,033 B2 | 5/2009 | Trezza | |
| 7,560,813 B2 | 7/2009 | Trezza | |
| 2004/0016995 A1* | 1/2004 | Kuo et al. | 257/678 |
| 2004/0027218 A1* | 2/2004 | Stafford et al. | 335/78 |
| 2006/0227405 A1* | 10/2006 | Regan | 359/290 |
| 2008/0006850 A1* | 1/2008 | Ribnicek et al. | 257/213 |
| 2008/0164594 A1* | 7/2008 | Tien et al. | 257/684 |
| 2008/0168838 A1* | 7/2008 | Martin et al. | 73/514.32 |
| 2008/0283989 A1* | 11/2008 | Jeung et al. | 257/682 |
| 2009/0194829 A1* | 8/2009 | Chung et al. | 257/415 |

* cited by examiner

*Primary Examiner* — Alexander Ghyka
(74) *Attorney, Agent, or Firm* — Haynes and Boone, LLP

(57) ABSTRACT

A cap and substrate having an electrical connection at a wafer level includes providing a substrate and forming an electrically conductive ground structure in the substrate and electrically coupled to the substrate. An electrically conductive path to the ground structure is formed in the substrate. A top cap is then provided, wherein the top cap includes an electrically conductive surface. The top cap is bonded to the substrate so that the electrically conductive surface of the top cap is electrically coupled to the path to the ground structure.

20 Claims, 4 Drawing Sheets

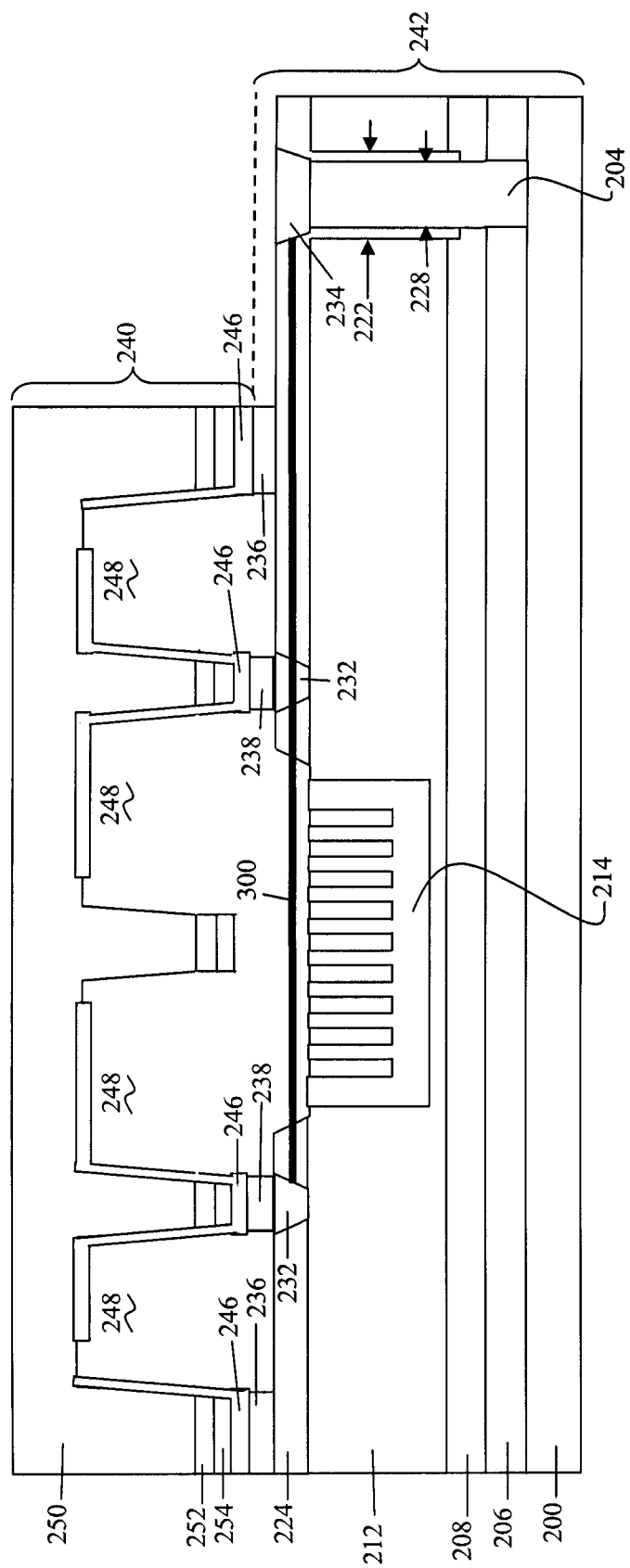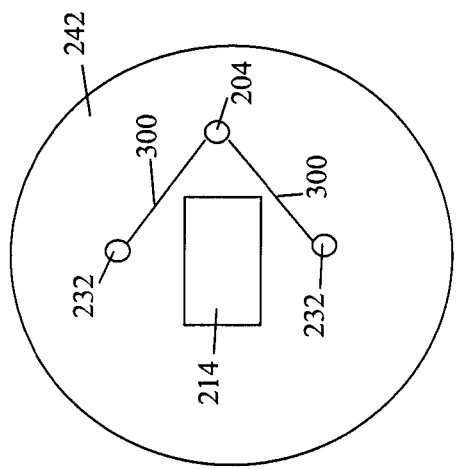
Fig. 3A
Fig. 3B

CAP AND SUBSTRATE ELECTRICAL CONNECTION AT WAFER LEVEL

BACKGROUND

The present disclosure relates generally to semiconductor manufacturing. Specifically, the present disclosure relates to an electrical connection between a semiconductor substrate and a top cap.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Microelectromechanical systems (MEMS) devices are very small electro-mechanical systems incorporated into semiconductor IC circuits. These MEMS devices commonly have a top-cap secured to the MEMS device to enclose, secure and/or protect the MEMS device. However, the traditional bonding to secure the cap to the MEMS device electrically insulates the substrate device from the cap device. Therefore, to electrically couple the top cap to the substrate and, as such, reduce static electrical potential between the substrate and the cap, secondary operations are traditionally performed to form an electrical path between the top cap and the substrate. For example, wires may be bonded between a metal surface on the cap and a conductive ground element of the substrate. In another example, a deep groove is cut through the top cap and into the substrate. A metal surface is then formed in the groove to provide electrical conductivity between the top cap and the substrate.

These secondary operations of bonding wires and cutting grooves are time consuming, expensive and add a possibility of part defects. Therefore, what is needed is an improved system for electrical conductivity between a semiconductor and a top cap.

SUMMARY

The present disclosure provides for many different embodiments of the present disclosure. In one embodiment, the present disclosure describes cap and substrate device having an electrical connection at a wafer level, which includes providing a substrate and forming an electrically conductive ground structure in the substrate and electrically coupled to the substrate. An electrically conductive path to the ground structure is formed in the substrate. A top cap is then provided, wherein the top cap includes an electrically conductive surface. The top cap is bonded to the substrate so that the electrically conductive surface of the top cap is electrically coupled to the path to the ground structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3A is a cross-sectional view illustrating an embodiment of a device according to the steps of the method of FIG. 1.

FIG. 3B is a top view illustrating an embodiment of the device of FIG. 3A.

DETAILED DESCRIPTION

Figure 1:
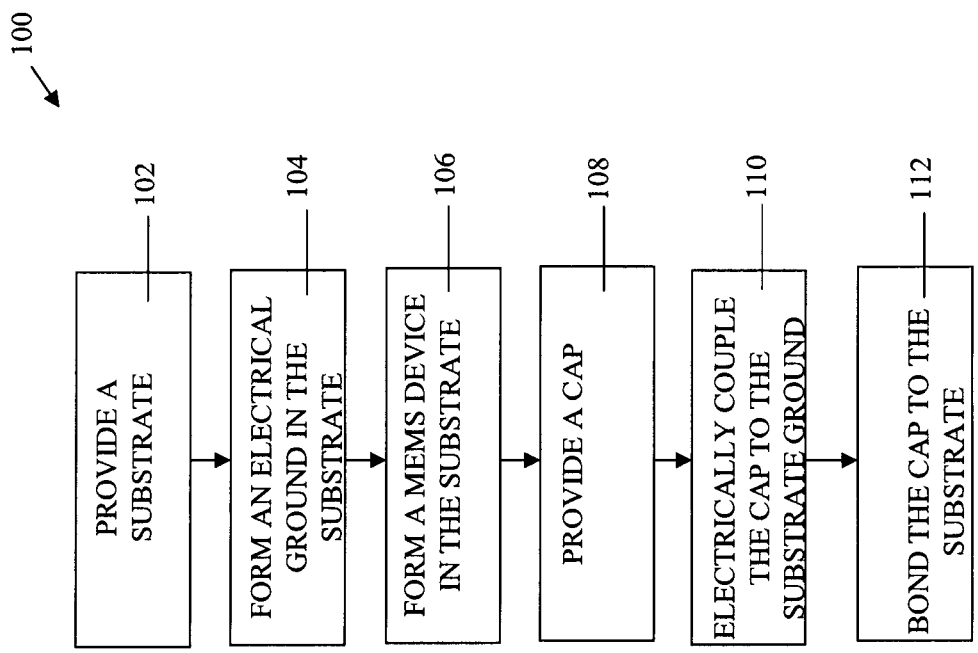
FIG. 1 is a flow chart illustrating an embodiment of a method of electrical contact between a substrate and top cap.

The present disclosure relates generally to semiconductor manufacturing. Specifically, the present disclosure relates to an electrical connection between a semiconductor substrate and a top cap.

It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices. Furthermore, the MEMS device structure or design illustrated is exemplary only and not intended to be limiting in any manner.

FIG. 1 provides a flow chart illustrating an embodiment of a method 100 of electrical contact between a substrate and top cap. FIGS. 2, 3A, 3B and 4 illustrate views of embodiments of MEMS devices according to the method of FIG. 1. The method 100 provides for a semiconductor and top cap integrated fabrication process. One of ordinary skill in the art would recognize additional steps that may be included in the method 100 and/or omitted from the method 100. The method 100 and the corresponding FIGS. 2, 3A, 3B and 4 are exemplary only and not intended to be limiting. For example, the structure of the MEMS devices depicted in FIGS. 2, 3A, 3B and 4 are exemplary only and similar methods may be used to form any similar device. CMOS circuitry may be included in the device depicted in FIGS. 2, 3A, 3B and 4.

Figure 2:
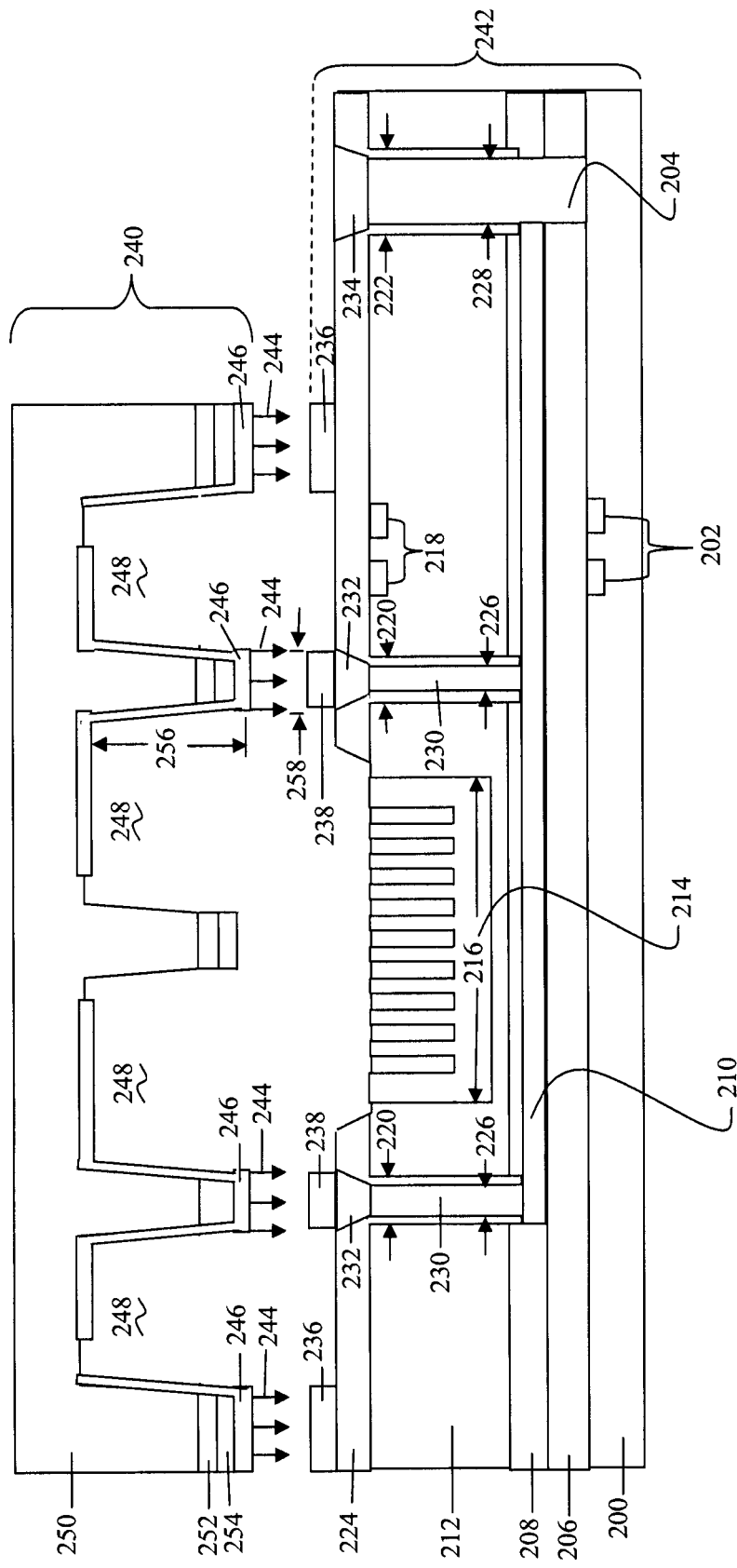
FIG. 2 is a cross-sectional view illustrating an embodiment of a device according to the steps of the method of FIG. 1.

The method 100 begins at block 102 where a substrate (e.g., a semiconductor wafer) is provided. Referring to the example of FIG. 2, illustrated is a substrate 200. In an embodiment, the substrate 200 is a silicon (Si) substrate 200. The substrate 200 may be crystalline Si or poly Si. In an embodiment, the substrate 200 is silicon in a crystalline structure. In alternative embodiments, the substrate 200 may include other elementary semiconductors such as germanium, or may include a compound semiconductor such as, silicon carbide, gallium arsenide, indium arsenide, and indium phosphide. The substrate 200 may include a silicon on insulator (SOI)

substrate. One or more isolation features may be formed on the substrate 200. The substrate 200 may also include one or more CMOS devices 202, such as transistors (e.g., NMOS and/or PMOS transistors). The substrate 200 may include circuitry associated with the transistors such as interconnect layers (e.g., metal lines and vias) and interlayer dielectric layers (ILD).

The method 100 continues to block 104 where an electrical ground structure 204 is formed on the substrate 200. The ground structure 204 is electrically coupled to the substrate 200. In an embodiment, the ground structure 204 is bonded to the substrate 200. In another embodiment, dielectric layers 206 and 208 (e.g., insulator layers) are formed on the substrate 200. In an embodiment, the dielectric layers 206 and 208 include an oxide. There may be any number of dielectric layers formed on the substrate 200. However, it is not required that any layers of dielectric be applied to the substrate 200. The dielectric layers 206 and 208 may be silicon oxide layers. However, it is contemplated that other types of dielectric layers may be formed on the substrate 200. The dielectric layers 206 and 208 may be formed on the substrate 200 by bonding, depositing, growing and thermally oxidizing, chemical vapor deposition (CVD) or other methods known in the art for forming dielectric layers on a substrate 200.

As provided in an embodiment shown in FIG. 2, an electrically conductive layer 210 is formed on the substrate 200. The conductive layer 210 may be formed from a metal, such as tungsten, aluminum, copper, nickel or any other metal. However, any electrically conductive material may be used to form the conductive layer 210. It should be understood that the conductive layer 210 may be formed using patterning, masking, deposition (e.g., physical vapor deposition) and/or any other methods now known or known in the future for forming the conductive layer 210 on the substrate 200. In an embodiment, the conductive layer 210 is formed between the dielectric layers 206 and 208 and is a patterned connection structure.

Above the dielectric layer 208 is another silicon layer 212, thus, forming a silicon on insulator (SOI) structure. The silicon layer 212 may be formed on the dielectric layer 208 by bonding (e.g., by chemical vapor deposition (CVD)), by growing the layer 212 or by other methods now known or known in the future. In an embodiment, the silicon layer 212 is thicker than the substrate silicon layer 200. If the silicon layer 212 is grown on the dielectric layer 208, in an embodiment, the silicon layer 212 may be formed from amorphous poly silicon. If the silicon layer 212 is bonded to the dielectric layer 208, in an embodiment, the silicon layer 212 may be formed from crystalline or amorphous poly silicon. As should be understood, bonding may be at a wafer level (e.g., bonding then dicing) or at a chip level (e.g., dicing then bonding).

The method 100 then proceeds to block 106 where a microelectromechanical system (MEMS) device 214 (a MEMS device in whole or in part) is formed on silicon layer 212. The MEMS device 214 may include a plurality of elements formed on metal, polysilicon, dielectric, and/or other materials known in the art. The MEMS device 214 may include materials typically used in a conventional CMOS fabrication process. Any configuration of MEMS device 214 may be possible, depending on the desired functionality. One or more of the elements depicted may be designed to provide MEMS mechanical structures of the MEMS device. The MEMS mechanical structures may include structures or elements operable for mechanical movement. The MEMS device 214 may be formed using typical processes used in CMOS fabrication, for example, photolithography, etching processes (e.g., wet etch, dry etch, plasma etch), deposition processes, plating processes, and/or other suitable processes. In an embodiment, the MEMS device 214 may be a motion sensor (e.g., a gyroscope, an accelerometer, etc.), a radio frequency (RF) MEMS device (e.g., an RF switch, filter, etc.), an oscillator, or any other MEMS type device. In an embodiment, the size 216 of the MEMS device 214 may be approximately 400 µm to approximately 1.2 mm wide. However, other sizes of MEMS devices are contemplated. If the silicon layer 212 is bonded to the dielectric layer 208, the MEMS device 214 may be formed before or after the bonding. If the silicon layer 212 is grown on the dielectric layer 208, the MEMS device 214 is formed after the growing of the silicon layer 212.

The substrate 212 may also include one or more CMOS devices 218, such as transistors (e.g., NMOS and/or PMOS transistors). The substrate 212 may include circuitry associated with the transistors such as interconnect layers (e.g., metal lines and vias) and interlayer dielectric layers (ILD).

Channels 220 and 222 are formed in the substrate 212. The channels 220 and 222 extend through the substrate 212 and to the conductive layer 210. Any method for forming the channels 220 and 222 (e.g., masking and etching) may be used to form the channels 220 and 222.

A dielectric layer 224 (e.g., insulator layer) may be formed on the substrate 212 and in the channels 220 and 222. In an embodiment, the dielectric layer 224 includes an oxide. There may be any number of dielectric layers formed on the substrate 212. However, it is not required that any layers of dielectric be applied to the substrate 212. The dielectric layer 224 may be silicon oxide layers. However, it is contemplated that other types of dielectric layers may be formed on the substrate 212. The dielectric layer 224 may be formed on the substrate 212 by bonding, depositing, growing and thermally oxidizing, chemical vapor deposition (CVD) or other methods known in the art for forming dielectric layers on a substrate 212.

Channels 226 and 228 are formed in the dielectric layer 224. The channels 226 extend through the dielectric layer 224 and through the substrate 212 and to the conductive layer 210. The channel 228 extends through the dielectric layer 224, through the substrate 212, through the dielectric layers 206 and 208 and to the substrate layer 200. Any method for forming the channels 226 and 228 (e.g., masking and etching) may be used to form the channels 226 and 228.

Electrically conductive plugs 230 are formed in the channels 226. Similarly, the ground structure 204 may be formed in the channel 228. There can be any number of plugs 230 and ground structures 204. In an embodiment, the plugs 230 and the ground structure 204 are formed from a conductive metal, such as, tungsten, aluminum, copper, nickel or other conductive metals. However, any electrically conductive substance may be used to form the plugs 230 and the ground structure 204. It should be understood that the plugs 230 and the ground structure 204 may be formed using patterning, masking, deposition (e.g., physical vapor deposition (PVD), chemical vapor deposition (CVD)) and/or any other methods now known or known in the future for forming the plugs 230 and/or the ground structure 204.

Similarly, electrically conductive layers 232 and 234 may be respectively formed on the plugs 230 and the ground structure 204. Any electrically conductive material may be used for the layers 232 and 234. To assist in bonding a top cap structure 240 to the MEMS wafer substrate structure 242 described above, an electrically conductive bonding pads 236 and 238 may be formed respectively on the dielectric 224 and the conductive layers 232.

The method 100 continues to block 108 where a top cap structure 240 is provided. The method 100 then continues to blocks 110 and 112 where the top cap structure 240 is formed and electrically coupled (block 110) to and bonded 244 (block 112) to the MEMS wafer substrate structure 242 to seal and protect the MEMS device 214. In an embodiment, the top cap structure 240 is bonded by a hermetically sealed bonding to the MEMS wafer substrate structure 242. One method of bonding 244 the top cap structure 240 with the MEMS wafer substrate structure 240 is performed using a metal-to-metal and/or alloy bond, such as Al—Al, Cu—Cu, Ni—Ni and the like. Thus, the bonding pads 236 and 238 bond with metal surfaces 246. The bonding pad surfaces are not required to be formed of like metals or alloys. Any method of bonding 244 the metal surfaces 236, 238 and 246 may be used. It should be understood that the electrically conductive surfaces 246 provide a conductive path from the top cap 240 to the substrate 200 via the bonding pads 238, the conductive layer 232, the plugs 230, the conductive layer 210 and the ground structure 204. Thus, static electricity from the top cap 240 relative to the MEMS wafer substrate structure 240 is transferred to the substrate 200. As should be understood, this electrical grounding of the top cap structure 240 increases durability of the structure 242. The surfaces 246 may be continuous across the lower surface of the top cap, including the cavities 248, or they may be discontinuous, as shown in FIG. 2. Additionally, the surfaces 246 may be formed from any electrically conductive material.

Structure and forming of the top cap structure 240 may be substantially similar to the methods and materials as that described above for the MEMS wafer structure 240. The top cap structure 240 may be formed 180 degrees from that shown in FIG. 2 and then flipped to be oriented as shown to bond 244 with the MEMS wafer structure 240. The top cap structure 240 may be formed on a silicon substrate 250 and may include one or more optional dielectric (e.g., insulative) layers 252 and 254. The dielectric layers 252 and 254 may include an oxide, such as silicon oxide or poly silicon. If the top cap structure 240 includes one or more dielectric layers 252 or 254, the conductive surface 246 may extend, at least partially, up into the cavities 248 to allow electrically charge on the capping structure 240 to be grounded to the MEMS wafer structure 240. Any known methods may be used to form the cavities 248 and the layers 252, 254 and 246 on the substrate 250. In an embodiment, the cavities 248 may be approximately 40 μm to approximately 200 μm tall 256. In an embodiment, the metal surfaces 238 and 246 may be approximately 80 μm wide 258. However, other dimensions may be used for aspects of the present disclosure.

FIG. 3A is a cross-sectional view illustrating an embodiment of a device according to the steps of the method of FIG. 1. FIG. 3B is a top view illustrating an embodiment of the device of FIG. 3A. The device of FIGS. 3A and 3B may be formed using the steps of FIG. 1 and maybe formed substantially similar to the device illustrated in FIG. 2. The device of FIG. 3a is shown having the top cap structure 240 already bonded to the MEMS wafer structure 240. A notable difference in the device of FIG. 2 and the device of FIGS. 3A and 3B is that the channels 220 and 226 and the plugs 230 do not need to be formed in the substrate 212. Alternatively, electrically conductive traces 300 may be formed to electrically couple the bonding feature layers 232 to the ground structure 204. The traces 300 may be formed from a conductive metal, such as, tungsten, aluminum, copper, nickel or other conductive metals. However, any electrically conductive substance may be used to form the traces 300. It should be understood that the traces 300 may be formed using patterning, masking, deposition (e.g., physical vapor deposition (PVD), chemical vapor deposition (CVD)) and/or any other methods now known or known in the future for forming the traces 300.

Similarly to that for the device illustrated in FIG. 2, the device illustrated in FIGS. 3A and 3B provides an electrically conductive path from the top cap structure 240 (e.g., the surfaces 246) to the substrate 200. In different embodiments, the traces 300 may be formed below, above or in the dielectric layer 224. However, it should be understood that other levels for the traces 300 will provide a conductive path to the ground structure 204. As shown in FIG. 3B, the traces 300 may be formed to go around the MEMS device 214 so as to not interfere with operation of the MEMS device 214. The device of FIGS. 3A and 3B may also include one or more CMOS devices, such as transistors (e.g., NMOS and/or PMOS transistors) in substrates 200 and/or 212. Accordingly, the substrates 200 and/or 212 may include circuitry associated with the transistors such as interconnect layers (e.g., metal lines and vias) and interlayer dielectric layers (ILD).

Figure 4:
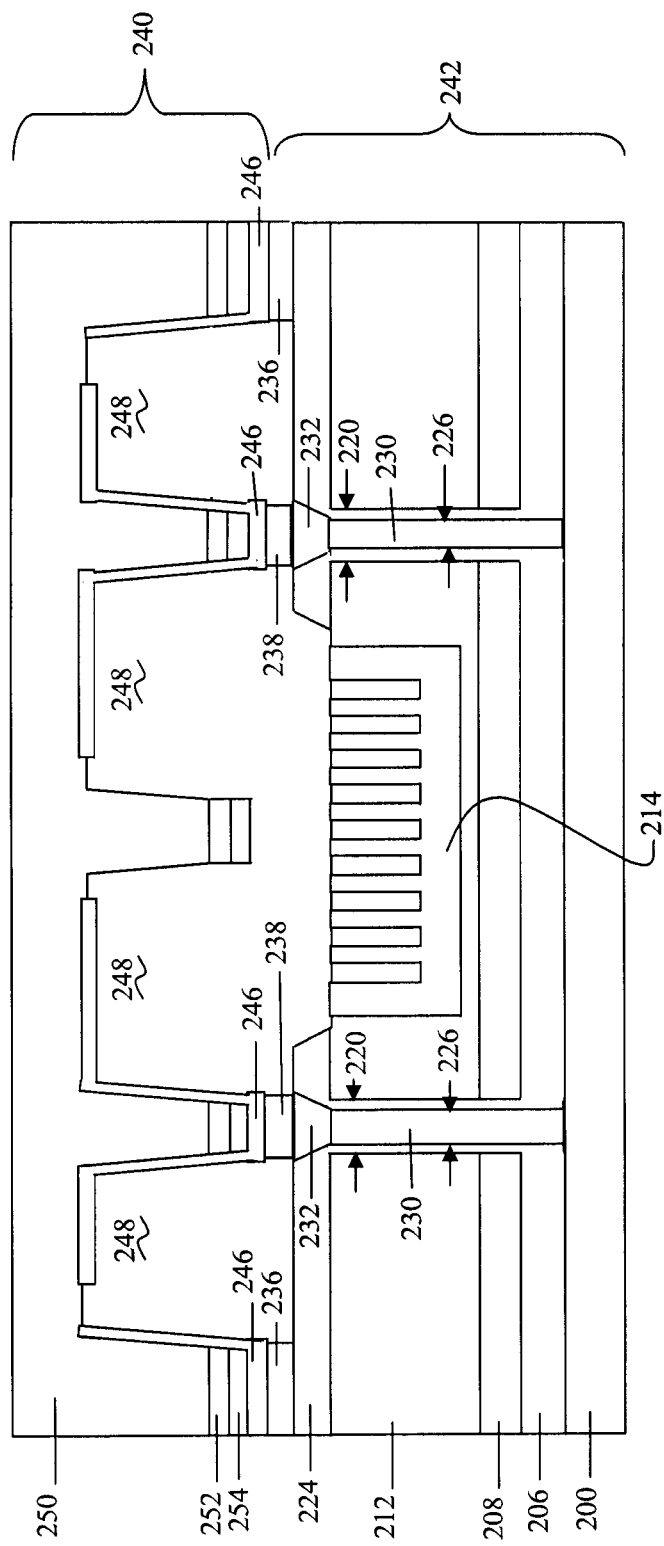
FIG. 4 is a cross-sectional view illustrating an embodiment of a device according to the steps of the method of FIG. 1.

FIG. 4 is a cross-sectional view illustrating an embodiment of a device according to the steps of the method of FIG. 1. The device of FIG. 4 may be formed using the steps of FIG. 1 and maybe formed substantially similar to the device illustrated in FIG. 2. The device of FIG. 4 is shown having the top cap structure 240 already bonded to the MEMS wafer structure 240. A notable difference in the device of FIG. 2 and the device of FIG. 4 is that the conductive layer 210 and the ground structure 204 do not need to be formed in the substrate 212 and the dielectric 208. Alternatively, channels 220 and 226 and the plugs 230 may be formed to contact the substrate 200, thereby electrically coupling the bonding feature layers 232 to the substrate 200. As such, the plugs 230 may be considered as the ground structure. The plugs 230 may be formed from a conductive metal, such as, tungsten, aluminum, copper, nickel or other conductive metals. However, any electrically conductive substance may be used to form the plugs 230. It should be understood that the plugs 230 may be formed using patterning, masking, deposition (e.g., physical vapor deposition (PVD), chemical vapor deposition (CVD)) and/or any other methods now known or known in the future for forming the plugs 230.

Similarly to that for the device illustrated in FIG. 2, the device illustrated in FIG. 4 provides an electrically conductive path from the top cap structure 240 (e.g., the surfaces 246) to the substrate 200. The device of FIG. 4 may also include one or more CMOS devices, such as transistors (e.g., NMOS and/or PMOS transistors) in substrates 200 and/or 212. Accordingly, the substrates 200 and/or 212 may include circuitry associated with the transistors such as interconnect layers (e.g., metal lines and vias) and interlayer dielectric layers (ILD).

As should be understood, the internal grounding for the top cap structures 240 provided in the present disclosure reduce secondary operations for grounding the top cap, when compared to the wire bonding methods used traditionally. As such, it follows that the present disclosure provides a cap and substrate electrical connection at a wafer level that has a lower manufacturing cost, less secondary manufacturing steps and reduced possibilities for defects.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   providing a first substrate;
   forming an electrically conductive ground structure in the first substrate and electrically coupled to a third substrate, wherein the electrically conductive ground structure extends from a top surface of the first substrate to an opposing bottom surface of the first substrate;
   forming a dielectric layer interposed between the first substrate and the third substrate;
   forming a conductive layer within the dielectric layer, wherein the conductive layer physically contacts the electrically conductive ground structure;
   providing a top cap, wherein the top cap includes a second substrate and an electrically conductive surface that is electrically coupled to the second substrate; and
   bonding the top cap to the top surface of the first substrate so that the second substrate is electrically coupled to the ground structure.

2. The method of claim 1, including forming a microelectromechanical system (MEMS) device on the first substrate.

3. The method of claim 2, wherein the MEMS device is formed as one of a motion sensing MEMS device, a radio frequency (RF) MEMS device and an oscillator MEMS device.

4. The method of claim 1, including forming an electronic device on the first substrate.

5. The method of claim 4, wherein the forming the electronic device includes forming the electronic device as a complimentary metal oxide semiconductor (CMOS) device.

6. The method of claim 1, wherein the bonding the top cap to the first substrate includes hermetically sealing the top cap to the first substrate.

7. The method of claim 1, includes forming the first substrate having a silicon on insulator (SOI) device.

8. A method comprising:
   providing a first substrate;
   forming a microelectromechanical system (MEMS) device on the first substrate;
   forming an electrically conductive ground structure in the first substrate, wherein the electrically conductive ground structure extends from a top surface of the first substrate to an opposing bottom surface of the first substrate;
   providing a top cap, wherein the top cap includes a second substrate and an electrically conductive surface that at least partially covers the second substrate;
   bonding the top cap to the first substrate so that the second substrate of the top cap is electrically coupled to the ground structure through the electrically conductive surface;
   forming an electrically conductive path to the ground structure in the first substrate; and
   depositing a metal layer on the path to the ground structure, wherein the forming the path to the ground structure includes depositing a metal to form the path.

9. The method of claim 8, wherein the MEMS device is formed as one of a motion sensing MEMS device, a radio frequency (RF) MEMS device and an oscillator MEMS device.

10. The method of claim 8, including forming an electronic device on the first substrate.

11. The method of claim 10, wherein the forming the electronic device includes forming the electronic device as a complimentary metal oxide semiconductor (CMOS) device.

12. The method of claim 8, wherein the bonding the top cap to the substrate includes hermetically sealing the top cap to the first substrate.

13. The method of claim 8, includes forming the first substrate having a silicon on insulator (SOI) device.

14. The method of claim 8, further including:
   forming an electrically conductive path to the ground structure in the first substrate; and
   depositing a metal layer on the path to the ground structure;
   wherein the forming the path to the ground structure includes depositing a metal to form the path.

15. A method comprising:
   forming an electrically conductive ground structure in a first substrate, wherein the electrically conductive ground structure extends completely through the first substrate to a top surface of a third substrate, wherein the electrically conductive ground structure physically contacts the top surface of the third substrate such that first substrate and the third substrate are electrically coupled together;
   forming a dielectric layer over the third substrate, wherein the electrically conductive ground structure extends completely through the dielectric layer;
   forming a conductive layer within the dielectric layer, wherein the conductive layer physically contacts the conductive ground structure; and
   bonding a top cap having an electrically conductive surface to the first substrate so that the second substrate is electrically coupled to the ground structure.

16. The method of claim 15, wherein forming the conductive layer within the dielectric layer includes forming an electrically conductive path to the ground structure within the dielectric layer and depositing a metal layer on the electrically conductive path.

17. The method of claim 15, further comprising forming a microelectromechanical system device on the first substrate.

18. The method of claim 15, wherein forming the dielectric layer over the third substrate includes forming a first dielectric material layer and second dielectric material layer over the third substrate.

19. The method of claim 15, further comprising forming another dielectric layer over the first substrate such that the another dielectric layer is interposed between the first substrate and the top cap.

20. The method of claim 1, wherein the electrically conductive ground structure extends completely through the dielectric layer.

* * * * *